United States Patent
Somekh et al.

(10) Patent No.: US 10,851,450 B2
(45) Date of Patent: *Dec. 1, 2020

(54) METHOD AND APPARATUS FOR LOAD-LOCKED PRINTING

(71) Applicant: Kateeva, Inc., Newark, CA (US)

(72) Inventors: Sass Somekh, Los Altos, CA (US); Eliyahu Vronsky, Los Altos, CA (US); Conor F. Madigan, San Francisco, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/409,844

(22) Filed: Jan. 19, 2017

(65) Prior Publication Data

US 2017/0130315 A1    May 11, 2017

Related U.S. Application Data

(60) Continuation of application No. 14/996,086, filed on Jan. 14, 2016, which is a continuation of application
(Continued)

(51) Int. Cl.
*B41J 2/015* (2006.01)
*B41J 2/14* (2006.01)
(Continued)

(52) U.S. Cl.
CPC .......... *C23C 4/137* (2016.01); *B05B 17/0638* (2013.01); *B05B 17/0646* (2013.01);
(Continued)

(58) Field of Classification Search
None
See application file for complete search history.

(56) References Cited

U.S. PATENT DOCUMENTS 3,216,858 A    11/1965 Bogdanowski
3,251,139 A    5/1966 Strimling
(Continued)

FOREIGN PATENT DOCUMENTS

CN    1416365 A    5/2003
CN    1445089 A    10/2003
(Continued)

OTHER PUBLICATIONS

CN First Office Action dated Mar. 27, 2017 for CN patent Application No. 201610181336.1.
(Continued)

*Primary Examiner* — James M Mellott
(74) *Attorney, Agent, or Firm* — Hauptman Ham, LLP

(57) ABSTRACT

The disclosure relates to a method and apparatus for preventing oxidation or contamination during a circuit printing operation. The circuit printing operation can be directed to OLED-type printing. In an exemplary embodiment, the printing process is conducted at a load-locked printer housing having one or more of chambers. Each chamber is partitioned from the other chambers by physical gates or fluidic curtains. A controller coordinates transportation of a substrate through the system and purges the system by timely opening appropriate gates. The controller may also control the printing operation by energizing the print-head at a time when the substrate is positioned substantially thereunder.

19 Claims, 9 Drawing Sheets

Related U.S. Application Data

No. 13/776,602, filed on Feb. 25, 2013, now Pat. No. 9,248,643, which is a division of application No. 13/551,209, filed on Jul. 17, 2012, now Pat. No. 8,720,366, which is a continuation of application No. 12/652,040, filed on Jan. 5, 2010, now Pat. No. 8,383,202, which is a continuation-in-part of application No. 12/139,391, filed on Jun. 13, 2008, now abandoned.

(60) Provisional application No. 61/142,575, filed on Jan. 5, 2009.

(51) Int. Cl.

| | | |
|---|---|---|
| *B41J 11/00* | (2006.01) | |
| *B41J 29/393* | (2006.01) | |
| *B05C 13/02* | (2006.01) | |
| *H05B 33/10* | (2006.01) | |
| *B05D 5/00* | (2006.01) | |
| *B05B 17/00* | (2006.01) | |
| *B41M 5/00* | (2006.01) | |
| *H01L 51/00* | (2006.01) | |
| *H01L 51/56* | (2006.01) | |
| *H01L 33/00* | (2010.01) | |
| *C23C 4/137* | (2016.01) | |
| *H01L 21/677* | (2006.01) | |
| *B05C 5/02* | (2006.01) | |
| *B41J 2/165* | (2006.01) | |
| *B41J 2/315* | (2006.01) | |
| *B05C 15/00* | (2006.01) | |

(52) U.S. Cl.
CPC ............ *B05C 5/0208* (2013.01); *B05C 13/02* (2013.01); *B41J 2/015* (2013.01); *B41J 2/14* (2013.01); *B41J 2/16505* (2013.01); *B41J 2/315* (2013.01); *B41J 11/0015* (2013.01); *B41J 29/393* (2013.01); *B41M 5/0011* (2013.01); *H01L 21/67784* (2013.01); *H01L 33/005* (2013.01); *H05B 33/10* (2013.01); *B05C 15/00* (2013.01); *B05D 5/00* (2013.01); *B41J 2202/09* (2013.01); *B41J 2202/16* (2013.01); *H01L 51/0005* (2013.01); *H01L 51/56* (2013.01)

(56) References Cited

U.S. PATENT DOCUMENTS

| | | | |
|---|---|---|---|
| 3,498,343 A | | 3/1970 | Sperberg |
| 3,632,374 A | * | 1/1972 | Greiller .................. B05C 5/005 430/538 |
| 3,670,466 A | | 6/1972 | Lynch |
| 3,885,362 A | | 5/1975 | J |
| 4,226,897 A | | 10/1980 | Coleman |
| 4,581,478 A | | 4/1986 | Pugh et al. |
| 4,676,144 A | | 6/1987 | Smith |
| 4,693,175 A | | 9/1987 | Hashimoto |
| 4,721,121 A | | 1/1988 | Adams |
| 5,029,518 A | | 7/1991 | Austin |
| 5,065,169 A | | 11/1991 | Vincent et al. |
| 5,314,377 A | | 5/1994 | Pelosi |
| 5,344,365 A | | 9/1994 | Scott et al. |
| 5,562,539 A | | 10/1996 | Hashimoto et al. |
| 5,651,625 A | | 7/1997 | Smith et al. |
| 5,788,447 A | | 8/1998 | Yonemitsu et al. |
| 5,896,154 A | | 4/1999 | Mitani et al. |
| 6,023,899 A | | 2/2000 | Mecozzi |
| 6,049,167 A | | 4/2000 | Onitsuka et al. |
| 6,089,282 A | | 7/2000 | Spiegelman et al. |
| 6,375,304 B1 | | 4/2002 | Aldrich et al. |
| 6,437,351 B1 | | 8/2002 | Smick et al. |
| 6,604,810 B1 | | 8/2003 | Silverbrook |
| 6,781,684 B1 | * | 8/2004 | Ekhoff ................ B65G 49/061 356/237.1 |
| 6,869,636 B2 | | 3/2005 | Chung |
| 7,258,768 B2 | | 8/2007 | Yamazaki |
| 7,326,300 B2 | | 2/2008 | Sun et al. |
| 7,384,662 B2 | | 6/2008 | Takano et al. |
| 7,387,662 B2 | | 6/2008 | Ahman et al. |
| 7,530,778 B2 | | 5/2009 | Yassour et al. |
| 7,703,911 B2 | | 4/2010 | Chung et al. |
| 7,989,025 B2 | | 8/2011 | Sakai et al. |
| 8,383,202 B2 | * | 2/2013 | Somekh ............. B05B 17/0638 427/261 |
| 8,414,688 B1 | | 4/2013 | Delgado et al. |
| 8,720,366 B2 | | 5/2014 | Somekh et al. |
| 8,802,186 B2 | * | 8/2014 | Somekh ............. B05B 17/0638 427/261 |
| 8,802,195 B2 | * | 8/2014 | Somekh ............. B05B 17/0638 427/261 |
| 8,899,171 B2 | | 12/2014 | Mauck et al. |
| 9,048,344 B2 | | 6/2015 | Mauck et al. |
| 9,174,433 B2 | * | 11/2015 | Somekh ............. B05B 17/0638 |
| 9,248,643 B2 | * | 2/2016 | Somekh ............. B05B 17/0638 |
| 9,278,564 B2 | | 3/2016 | Mauck et al. |
| 9,387,709 B2 | | 7/2016 | Mauck et al. |
| 9,550,383 B2 | | 1/2017 | Lowrance et al. |
| 9,656,491 B1 | | 5/2017 | Lowrance et al. |
| 2001/0041530 A1 | | 11/2001 | Hara |
| 2002/0033860 A1 | | 3/2002 | Kubota et al. |
| 2002/0079057 A1 | | 6/2002 | Yoshioka et al. |
| 2002/0084464 A1 | | 7/2002 | Yamazaki et al. |
| 2002/0113846 A1 | * | 8/2002 | Wang .................. B41J 2/161 347/68 |
| 2002/0124906 A1 | | 9/2002 | Suzuki et al. |
| 2002/0191063 A1 | | 12/2002 | Gelbart et al. |
| 2003/0000476 A1 | * | 1/2003 | Matsunaga ............. C23C 16/54 118/719 |
| 2003/0040193 A1 | * | 2/2003 | Bailey ................... B08B 7/00 438/710 |
| 2003/0097929 A1 | | 5/2003 | Watanabe et al. |
| 2003/0175414 A1 | * | 9/2003 | Hayashi ................... B41J 2/145 427/66 |
| 2004/0050325 A1 | | 3/2004 | Samoilov et al. |
| 2004/0062856 A1 | | 4/2004 | Marcus et al. |
| 2004/0075385 A1 | * | 4/2004 | Tao .................... H01L 27/3283 313/506 |
| 2004/0086631 A1 | | 5/2004 | Han et al. |
| 2004/0115339 A1 | | 6/2004 | Ito |
| 2004/0118309 A1 | | 6/2004 | Fedor et al. |
| 2004/0123804 A1 | | 7/2004 | Yamazaki et al. |
| 2004/0254297 A1 | * | 12/2004 | Hsu ..................... B82Y 30/00 525/54.2 |
| 2005/0005850 A1 | * | 1/2005 | Yamazaki ............. C23C 14/568 118/719 |
| 2005/0040338 A1 | * | 2/2005 | Weiss ................... B65G 49/061 250/358.1 |
| 2005/0062773 A1 | | 3/2005 | Fouet |
| 2005/0140764 A1 | | 6/2005 | Chang et al. |
| 2005/0223994 A1 | * | 10/2005 | Blomiley ............. C23C 14/505 118/725 |
| 2006/0008591 A1 | * | 1/2006 | Sun .................... B05C 13/00 427/421.1 |
| 2006/0045669 A1 | | 3/2006 | Namioka et al. |
| 2006/0054774 A1 | * | 3/2006 | Yassour ................ B65G 51/03 248/631 |
| 2006/0096395 A1 | | 5/2006 | Weiss et al. |
| 2006/0099328 A1 | | 5/2006 | Waite et al. |
| 2006/0119669 A1 | | 6/2006 | Sharma et al. |
| 2006/0219605 A1 | | 10/2006 | Devitt |
| 2006/0236938 A1 | | 10/2006 | Powell et al. |
| 2006/0273713 A1 | | 12/2006 | Mehta et al. |
| 2007/0004328 A1 | | 1/2007 | Balzer |
| 2007/0021050 A1 | | 1/2007 | Kennedy |
| 2007/0026151 A1 | | 2/2007 | Higginson et al. |
| 2007/0044713 A1 | | 3/2007 | Yasui et al. |
| 2007/0046185 A1 | | 3/2007 | Kim |
| 2007/0099310 A1 | | 5/2007 | Vepa et al. |
| 2007/0234952 A1 | | 10/2007 | Kojima |

(56) References Cited

U.S. PATENT DOCUMENTS

| | | |
|---|---|---|
| 2007/0257033 A1 | 11/2007 | Yamada |
| 2008/0085652 A1 | 4/2008 | Winters |
| 2008/0206036 A1 | 8/2008 | Smith et al. |
| 2008/0241587 A1 | 10/2008 | Ohmi et al. |
| 2008/0259101 A1 | 10/2008 | Kurita et al. |
| 2008/0260938 A1 | 10/2008 | Ikeda et al. |
| 2008/0308037 A1 | 12/2008 | Bulovic et al. |
| 2008/0311307 A1 | 12/2008 | Bulovic et al. |
| 2009/0031579 A1 | 2/2009 | Piatt et al. |
| 2009/0058915 A1 | 3/2009 | Hayashi et al. |
| 2009/0078204 A1 | 3/2009 | Kerr et al. |
| 2009/0081885 A1 | 3/2009 | Levy et al. |
| 2009/0295857 A1 | 12/2009 | Kikuchi et al. |
| 2009/0324368 A1 | 12/2009 | Koparal et al. |
| 2010/0201749 A1 | 8/2010 | Somekh et al. |
| 2011/0043554 A1 | 2/2011 | Silverbrook et al. |
| 2011/0096124 A1 | 4/2011 | North et al. |
| 2011/0318503 A1 | 12/2011 | Adams et al. |
| 2012/0056923 A1 | 3/2012 | Vronsky et al. |
| 2012/0156365 A1 | 6/2012 | Ohara |
| 2012/0201749 A1 | 8/2012 | Crawshaw et al. |
| 2012/0306951 A1 | 12/2012 | Somekh et al. |
| 2013/0004656 A1 | 1/2013 | Chen et al. |
| 2013/0038649 A1 | 2/2013 | Lowrance et al. |
| 2013/0040061 A1 | 2/2013 | Lowrance et al. |
| 2013/0164438 A1 | 6/2013 | Somekh et al. |
| 2013/0164439 A1 | 6/2013 | Somekh et al. |
| 2013/0206058 A1 | 8/2013 | Mauck et al. |
| 2013/0209669 A1 | 8/2013 | Somekh et al. |
| 2013/0209670 A1 | 8/2013 | Somekh et al. |
| 2013/0209671 A1 | 8/2013 | Somekh et al. |
| 2013/0252533 A1 | 9/2013 | Mauck et al. |
| 2013/0307898 A1 | 11/2013 | Somekh et al. |
| 2014/0311405 A1 | 10/2014 | Mauck et al. |
| 2016/0207313 A1 | 7/2016 | Somekh et al. |
| 2017/0080730 A1 | 3/2017 | Mauck et al. |
| 2017/0136793 A1 | 5/2017 | Lowrance et al. |
| 2017/0239966 A1 | 8/2017 | Mauck et al. |
| 2017/0321911 A1 | 11/2017 | Mauck et al. |
| 2018/0326767 A1 | 11/2018 | Lowrance et al. |
| 2018/0370263 A1 | 12/2018 | Mauck et al. |

FOREIGN PATENT DOCUMENTS

| | | | |
|---|---|---|---|
| CN | 1722918 A | | 1/2006 |
| CN | 1956209 A | | 5/2007 |
| CN | 101088141 A | | 12/2007 |
| CN | 101189271 A | | 5/2008 |
| CN | 101243543 A | | 8/2008 |
| CN | 101357541 A | | 2/2009 |
| CN | 201446232 U | | 5/2010 |
| CN | 101754861 A | | 6/2010 |
| CN | 201812332 U | | 4/2011 |
| CN | 102328317 A | | 1/2012 |
| CN | 103171286 B | | 9/2016 |
| EP | 2973676 A2 | | 1/2016 |
| JP | 32098783 | | 6/1987 |
| JP | 2005502487 | | 4/1993 |
| JP | 549294 | | 6/1993 |
| JP | H09503704 A | | 4/1997 |
| JP | 11312640 | | 11/1999 |
| JP | 2000223548 A | | 8/2000 |
| JP | 2002069650 A | | 3/2002 |
| JP | 2002093878 A | | 3/2002 |
| JP | 2003173871 A | | 6/2003 |
| JP | 2003266007 A | | 9/2003 |
| JP | 2003272847 A | | 9/2003 |
| JP | 2004146369 A | | 5/2004 |
| JP | 2004164873 A | | 6/2004 |
| JP | 2004241751 A | | 8/2004 |
| JP | 2004247111 A | | 9/2004 |
| JP | 2004253332 A | | 9/2004 |
| JP | 2004291456 | | 10/2004 |
| JP | 2004362854 A | | 12/2004 |
| JP | 2004535956 A | | 12/2004 |
| JP | 2005074299 A | | 3/2005 |
| JP | 2005254038 A | | 9/2005 |
| JP | 2006026463 A | | 2/2006 |
| JP | 2006123551 A | | 5/2006 |
| JP | 2006150900 A | | 6/2006 |
| JP | 2006159116 | | 6/2006 |
| JP | 2007013140 A | | 1/2007 |
| JP | 2007122914 A | | 5/2007 |
| JP | 2007511890 | | 5/2007 |
| JP | 2007273093 A | | 10/2007 |
| JP | 2007299785 | | 11/2007 |
| JP | 2008004919 A | | 1/2008 |
| JP | 2008047340 A | | 2/2008 |
| JP | 2008511146 A | | 4/2008 |
| JP | 4423082 B2 | | 3/2010 |
| JP | 2010134315 A | | 6/2010 |
| JP | 2010533057 A | | 10/2010 |
| JP | 2010540775 A | | 12/2010 |
| JP | 2011092855 A | | 5/2011 |
| JP | 2011129275 A | | 6/2011 |
| JP | 2011225355 A | | 11/2011 |
| JP | 2011255366 A | | 12/2011 |
| JP | 4954162 B2 | | 6/2012 |
| JP | 2012525505 A | | 10/2012 |
| JP | 2013508560 A | | 3/2013 |
| KR | 20060044265 A | | 5/2006 |
| KR | 20060084048 A | | 7/2006 |
| KR | 20060088909 A | | 8/2006 |
| KR | 20070042272 A | | 4/2007 |
| KR | 1020070079834 A | | 8/2007 |
| KR | 20090126568 A | | 12/2009 |
| KR | 20120022197 A | | 3/2012 |
| KR | 20120128996 A | | 11/2012 |
| TW | 200302678 A | | 8/2003 |
| TW | 200303829 A | | 9/2003 |
| TW | I247554 | | 1/2006 |
| TW | 200618308 A | | 6/2006 |
| TW | 200714652 A | | 4/2007 |
| TW | 201107432 A | | 3/2011 |
| TW | 201208891 A | | 3/2012 |
| WO | 2001060623 A1 | | 8/2001 |
| WO | 2006021568 A1 | | 3/2006 |
| WO | 2011118652 A1 | | 9/2011 |
| WO | 2013023099 A1 | | 2/2013 |
| WO | 2013120054 A1 | | 8/2013 |

OTHER PUBLICATIONS

Examination Report dated Apr. 19, 2017 for TW Patent Application No. 103108995.

JP Office Action dated Apr. 26, 2017 for JP Patent Application No. 2016-90252.

Notice of Allowance dated May 18, 2017 for U.S. Appl. No. 14/543,786.

CN Second Office Action dated Mar. 24, 2017 for CN Patent Application No. 201480045349.5.

Notice of Allowance dated Mar. 29, 2017, to U.S. Appl. No. 15/423,169.

Fourth Office Action dated Mar. 25, 2016 for CN Application No. 201210596572.1.

Second Notice of Allowance dated Feb. 10, 2017, for U.S. Appl. No. 14/205,340.

Second Office Action dated Mar. 2, 2017, to CN Patent Application 201380052559.2.

Second Provisional Rejection dated Feb. 27, 2017 for KR Patent Application No. 10-2016-7014087.

Applicant Initiated Interview Summary dated Aug. 15, 2013, to U.S. Appl. No. 13/551,209.

Applicant-Initiated Interview Summary dated Aug. 20, 2014 for U.S. Appl. No. 13/802,304.

Applicant-Initiated Interview Summary dated Jun. 30, 2014 for U.S. Appl. No. 13/720,830.

Applicant-Initiated Interview Summary dated Oct. 19, 2012 for U.S. Appl. No. 12/652,040.

Applicant-Initiated Interview Summary dated Dec. 22, 2016 to U.S. Appl. No. 14/543,786.

(56) References Cited

OTHER PUBLICATIONS

CN Examination Report dated Aug. 13, 2015 for CN 201310704315. X.
Corrected Notice of Allowability dated Feb. 3, 2015 for U.S. Appl. No. 13/802,304.
Corrected Notice of Allowability dated Oct. 31, 2014 for U.S. Appl. No. 13/720,830.
Examination Report dated Apr. 26, 2016, to TW Patent Application 101148932.
Examiner Initiated Interview Summary dated Jun. 30, 2016 for U.S. Appl. No. 14/543,786.
Final Office Action dated Oct. 14, 2016 for U.S. Appl. No. 14/205,340.
Final Office Action dated Jun. 10, 2014, to U.S. Appl. No. 13/773,649.
Final Office Action dated Jun. 12, 2014, to U.S. Appl. No. 13/773,643.
Final Office Action dated Jun. 18, 2014, to U.S. Appl. No. 13/774,577.
Final Office Action dated Nov. 8, 2013, to U.S. Appl. No. 13/551,209.
Final Office Action dated Oct. 7, 2016 for U.S. Appl. No. 14/275,637.
Forrest, Stephen R., "The Path to Ubiquitous and Low-cost Organic Electronic Appliances on Plastic," Nature, Apr. 29, 2004, vol. 428, 8 pages.
International Search Report and Written Opinion dated Dec. 22, 2014, to PCT Application PCT/US14/023820.
International Search Report and Written Opinion dated Feb. 26, 2013 for PCT Application No. PCT/US12/70717.
International Search Report and Written Opinion dated Jun. 18, 2013 for PCT Application No. PCT/US13/031083.
International Search Report and Written Opinion dated Mar. 11, 2014, to PCT Application PCT/US13/063128.
International Search Report and Written Opinion dated Oct. 8, 2014, for corresponding PCT Application No. PCT/US2014/037722.
Japanese Official Action dated Jul. 28, 2016 for Japanese Patent Application No. 2014-548852.
Non-Final Office Action dated Apr. 15, 2015 to U.S. Appl. No. 13/776,602.
Non-Final Office Action dated Apr. 17, 2015, to U.S. Appl. No. 13/774,693.
Non-Final Office Action dated Apr. 24, 2013, to U.S. Appl. No. 13/551,209.
Non-Final Office Action dated Apr. 27, 2016, to U.S. Appl. No. 14/543,786.
Non-Final Office Action dated Apr. 28, 2014, to U.S. Appl. No. 13/720,830.
Non-Final Office Action dated Apr. 4, 2016, to U.S. Appl. No. 14/205,340.
Non-Final Office Action dated Dec. 31, 2013, to U.S. Appl. No. 13/774,577.
Non-Final Office Action dated Feb. 28, 2014, to U.S. Appl. No. 13/773,649.
Non-Final Office Action dated Feb. 7, 2014, to U.S. Appl. No. 13/773,641.
Non-Final Office Action dated Jan. 17, 2017 for U.S. Appl. No. 14/996,086.
Non-Final Office Action dated Jun. 14, 2012, to U.S. Appl. No. 12/652,040.
Non-Final Office Action dated Mar. 10, 2016 to U.S. Appl. No. 14/275,637.
Non-Final Office Action dated May 16, 2014, to U.S. Appl. No. 13/802,304.
Non-Final Office Action dated Nov. 20, 2015 for U.S. Appl. No. 14/637,301.
Non-Final Office Action dated Nov. 4, 2016 for U.S. Appl. No. 141543,786.
Non-Final Office Action dated Jul. 1, 2014, to U.S. Appl. No. 13/773,654.
Notice of Allowance dated Dec. 9, 2014 for U.S. Appl. No. 13/802,304.
Notice of Allowance dated Feb. 20, 2014, to U.S. Appl. No. 13/551,209.
Notice of Allowance dated Jul. 1, 2014, to U.S. Appl. No. 13/773,649.
Notice of Allowance dated Jul. 17, 2015 for U.S. Appl. No. 13/570,154.
Notice of Allowance dated Jul. 2, 2014, to U.S. Appl. No. 13/774,577.
Notice of Allowance dated Jun. 30, 2014, to U.S. Appl. No. 13/773,641.
Notice of Allowance dated May 16, 2016 to U.S. Appl. No. 14/637,301.
Notification of Provisional Rejection dated Jun. 14, 2016 for KR Application No. 10-2016-7014087.
CN First Office Action dated Jan. 23, 2017 for CN Patent Application No. 201480027671.5.
Examination Report dated Oct. 8, 2015, to TW Patent Application No. 102143142.
Extended European Search Report dated Jul. 1, 2016 for EP Application No. 13585304.2.
First Office Action dated Jun. 22, 2016 for CN 201480045349.5.
Notice of Allowance dated Jan. 31, 2017 for U.S. Appl. No. 14/205,340.
Notice of Allowance dated Dec. 7, 2012 to U.S. Appl. No. 12/652,040.
Notice of Allowance dated Nov. 19, 2015, to U.S. Appl. No. 13/776,602.
Notice of Allowance dated Oct. 6, 2014 for U.S. Appl. No. 13/720,830.
Notice of Allowance dated Sep. 9, 2015, to U.S. Appl. No. 13/774,693.
Notice of Allowance dated Sep. 29, 2014, to U.S. Appl. No. 13/773,654.
Notification of Provisional Rejection dated Aug. 22, 2016, to KR Patent Application No. 10-2015-7003107.
Notification of Provisional Rejection dated Dec. 9, 2015, for Korean Patent Application No. 10-2015-7014277.
Office Action dated Jun. 23, 2016, to CN Patent Application 201380052559.2.
Office Action issued to CN Patent Application 201210596572 dated Mar. 23, 2015.
Office Action Issued to CN Patent Application 201310704315.X dated Aug. 13, 2015.
Office Action issued to Japanese Patent Application No. 2015-544055, dated Oct. 20, 2015.
Office Action issued to JP Patent Application 2015-526775 dated Jan. 28, 2016.
Search Report dated Jul. 29, 2015 to CN Patent Application 201310704315.X.
Second Office Action issued to CN Patent Application 201210596572 dated Oct. 8, 2015.
Street et al., "Jet Printing of Active-Matrix TFT Backplanes for Displays and Sensors", IS&T Archiving, Dec. 2005, vol. 20, No. 5, 16 pages.
Third Office Action issued to CN Patent Application 201210596572 dated Jan. 26, 2016.
Applicant-Initiated Interview Summary dated Apr. 7, 2017 for U.S. Appl. No. 14/275,637.
Examination Report dated Apr. 12, 2017 for EP Patent Application No. 13858304.2.
TW Examination Report and Search Report dated Mar. 13, 2017 for TW Patent Application No. 105144240.
CN Third Office Action dated Jul. 12, 2017 for CN Patent Application No. 201480045349.5.
Extended European Search Report dated Apr. 12, 2017 for EP Patent Application No. 14810543.0.
Extended European Search Report dat Jun. 19, 2017 for EP Patent Application No. 14779907.6.
Final Office Action dated Jul. 28, 2017 for U.S. Appl. No. 14/996,086.
JP Office Action dated Jun. 1, 2017, to JP Patent Application No. 2016-501353.
KR Notification of Provisional Rejection dated May 25, 2017 for KR Patent Application No. 10-2014-7020478.
Supplemental Notice of Allowability dated Jun. 7, 2017 for U.S. Appl. No. 14/543,786.
TW Examination Report issued to TW Patent Application 105117833, dated May 10, 2017.
Applicant-Initiated Interview Summary dated Sep. 22, 2017, for U.S. Appl. No. 14/543,786.
CN First Office Action dated Aug. 1, 2017 for CN Patent Application No. 201610692510.9.

(56) References Cited

OTHER PUBLICATIONS

CN Second Office Action dated Jul. 31, 2017 for CN Patent Application No. 20140027671.5.
Corrected Notice of Allowability dated Aug. 25, 2017, to U.S. Appl. No. 15/385,803.
Corrected Notice of Allowability dated Aug. 9, 2017, to U.S. Appl. No. 15/385,803.
Corrected Notice of Allowability dated Sep. 20, 2017, to U.S. Appl. No. 15/385,803.
Non-Final Office Action dated Oct. 5, 2017, to U.S. Appl. No. 15/594,856.
Non-Final Office action dated Sep. 18, 2017, to U.S. Appl. No. 14/543,786.
Notice of Allowance dated Jul. 14, 2017, to U.S. Appl. No. 15/385,803.
Notice of Allowance dated Sep. 13, 2017, to U.S. Appl. No. 14/275,637.
Notification of Provisional Rejection dated Feb. 1, 2018 to KR Patent Application No. 10-2017-7018730.
Office action dated Feb. 2, 2018, to JP Patent Application No. 2016-519508.
Provisional Rejection dated Jan. 18, 2018 to KR Patent Application No. 10-2017-7018732.
Third Office Action dated Feb. 27, 2018, to CN Patent Application No. 201480027671.5.
EP Extended Search Report dated Mar. 9, 2018, to EP Patent Application No. 18155378.5.
Examiner-Initiated Interview Summary dated Apr. 5, 2018, to U.S. Appl. No. 14/275,637.
Final Office Action dated Mar. 7, 2018, to U.S. Appl. No. 14/543,786.
Non-Final Office Action dated Feb. 13, 2018 for U.S. Appl. No. 14/996,086.
Non-Final Office action dated Jan. 26, 2018, to U.S. Appl. No. 15/184,755.
Notice of Allowance dated Nov. 24, 2017, to U.S. Appl. No. 14/275,637.
Provisional Rejection dated Mar. 14, 2018, to KR Patent Application No. 10-2018-7003619.
Provisional Rejection dated Oct. 17, 2017, to KR Patent Application No. 10-2015-7027963.
Second CN Office Action dated Sep. 27, 2017 for CN Patent Application No. 201610181336.1.
Supplemental Notice of Allowance dated Nov. 1, 2017, to U.S. Appl. No. 14/275,637.
Applicant-Initiated Interview Summary dated May 30, 2018, to U.S. Appl. No. 15/184,755.
Examination Report dated Mar. 22, 2018, to TW Patent Application No. 103117122.
Final Office Action dated May 14, 2018, to JP Patent Application No. 2016-148189.
Notice of Allowance dated Feb. 9, 2018, for U.S. Appl. No. 14/275,637.
Penultimate Office action dated Mar. 22, 2018, to JP Patent Application No. 2016-90252.
Corrected Notice of Allowability dated Jun. 26, 2018, to U.S. Appl. No. 15/594,856.
Non-Final Office Action dated Jun. 29, 2018, to U.S. Appl. No. 15/605,806.
Notice of Allowability dated Jun. 29, 2018, to U.S. Appl. No. 14/275,637.
Notice of Allowance dated Jun. 29, 2018, to U.S. Appl. No. 15/184,755.
Notice of Allowance dated Mar. 9, 2018, to U.S. Appl. No. 15/594,856.
Corrected Notice of Allowability dated Oct. 23, 2018, to U.S. Appl. No. 14/996,086.
Interview Summary dated Oct. 23, 2018, to U.S. Appl. No. 14/996,086.
Notice of Allowance dated Oct. 18, 2018, to U.S. Appl. No. 14/543,786.
Office action dated Sep. 3, 2018, to CN Patent Application No. 201710428301.8.
Provisional Rejection dated Sep. 10, 2018, to KR Patent Application No. 10-2018-7016567.
CN First Office Action dated Jun. 26, 2018 for CN Patent Application No. 201710427402.3.
Examination report dated Aug. 13, 2018, to TW Patent Application 106145084.
Non-Final Office action dated Oct. 17, 2018, to U.S. Appl. No. 15/446,984.
Notice of Allowance dated Sep. 17, 2018, to U.S. Appl. No. 15/184,755.
Notice of Allowance dated Sep. 24, 2018, U.S. Appl. No. 14/275,637.
Notice of Allowance dated Sep. 26, 2018, to U.S. Appl. No. 14/996,086.
Office Action dated Aug. 3, 2017, to JP Patent Application No. 2016-148189.
Office Action dated Jan. 28, 2016, to JP Patent Application No. 2015-526775.
Provisional Rejection dated Jul. 6, 2018, to KR Patent Application No. 9-5-2018-046228232.
Rejection Decision dated Jul. 25, 2018, to TW Patent Application No. 103117122.
Notice of Allowance dated Nov. 21, 2018, to U.S. Appl. No. 14/996,086.
Notification of First Refusal dated Oct. 23, 2018, to KR Patent application No. 10-2017-7018730.
Notification of First Refusal dated Oct. 23, 2018, to KR Patent application No. 10-2017-7018732.
Office action dated Oct. 8, 2018, to CN Patent Application No. 201610837821.X.
Final Office action dated Nov. 21, 2018, to JP Patent Application No. 2016-090252.
Notice of Allowance dated Dec. 13, 2018 to U.S. Appl. No. 15/184,755.
Second Office Action dated Jun. 26, 2018 for CN Patent Application No. 201710427402.3.
EP Search report dated Mar. 25, 2019, in EP Patent Application No. 18201256.7.
European Search Report dated Apr. 17, 2019, EP Patent Application No. 19162637.3
Examination Report dated Mar. 27, 2019, in TW Patent Application No. 107102956.
Final Office Action dated Mar. 22, 2019, in U.S. Appl. No. 15/446,984.
Non Final Office Action dated Mar. 28, 2019, in U.S. Appl. No. 16/102,392.
Notice of Allowance dated Apr. 17, 2019, in U.S. Appl. No. 15/184,755.
Notice of Allowance dated Apr. 4, 2019, in U.S. Appl. No. 15/106,907.
Notice of Allowance dated Feb. 14, 2019, in U.S. Appl. No. 14/275,637.
Notice of Allowance dated Mar. 8, 2019, in U.S. Appl. No. 14/275,637.
Notification of Provisional Rejection dated Apr. 4, 2019, in KR Patent Application No. 10-2019-7008155.
Office Action dated Apr. 26, 2019, in CN Patent Application No. 201610837821.X.
Provisional Rejection dated Feb. 25, 2019, in KR Patent Application No. 20187027231.
Second Office Action dated Mar. 5, 2019, in CN Patent Application No. 201580023550.8.
Examination Report dated May 2, 2019 for TW Application No. 107116642.
Examination Report dated May 20, 2019 for EP Application 14810543.0.
Final Office Action dated Aug. 5, 2019 to U.S. Appl. No. 16/102,392.
Final Office Action dated Jul. 9, 2019 to U.S. Appl. No. 14/996,086.
Notice of Allowance dated Aug. 5, 2019 to U.S. Appl. No. 15/421,190.
Notice of Allowance dated Jul. 22, 2019 to U.S. Appl. No. 15/417,583.
Notice of First Refusal dated Jul. 22, 2019 for KR Application 10-2017-7031818.
Non Final Office Action dated Aug. 9, 2019 to U.S. Appl. No. 14/543,786.

(56) References Cited

OTHER PUBLICATIONS

Office Action dated Jul. 16, 2019 to JP Application 2018-115532.
Office Action dated Jun. 28, 2019 to JP Application No. 2018-156034.
Office Action dated May 7, 2019 for JP Application 2018-142544.
Official Action dated Jul. 30, 2019 for JP Application No. 2018-107016.
Second Office Action dated Jul. 2, 2019 for CN Application No. 201710914561.6.
Office Action dated Apr. 23, 2019 in Japanese Patent Application No. 2018-140175.
Examination Report dated Dec. 5, 2019 in TW Patent Application No. 108100450.
Final Office Action dated Jan. 7, 2020 in U.S. Appl. No. 16/362,595.
Office Action dated Jan. 21, 2020 for JP Patent Application No. 2016-90252.
Non Final Office Action dated Oct. 3, 2019 is U.S. Appl. No. 16/362,595.
Notice of Allowance dated Jan. 6, 2020 in U.S. Appl. No. 14/543,786.
Notice of Allowance dated Oct. 23, 2019 in U.S. Appl. No. 16/102,392.
Notice of Allowance dated Oct. 4, 2019 in U.S. Appl. No. 15/417,583.
Notice of Allowance dated Sep. 16, 2019 in U.S. Appl. No. 14/996,086.
Notice of Provisional Rejection dated Jan. 7, 2020 in KR Patent Application 10-2019-7037354.
Office Action dated Dec. 24, 2019 in JP Patent Application No. 2018-140175.
Office Action dated Dec. 18, 2019 in CN Patent Application No. 201811010130.8.
Office Action dated Dec. 18, 2019 in TW Patent Application No. 108102087.
Penultimate Office Action dated Aug. 29, 2019 in JP Patent Application No. 2017-114390.
Office Action dated Jun. 16, 2020 for JP Patent Application No. 2019-246.
Office Action dated Jun. 28, 2020 to CN Patent Application No. 201710914561.6.

* cited by examiner

METHOD AND APPARATUS FOR LOAD-LOCKED PRINTING

CROSS REFERENCE TO RELATED APPLICATIONS

This application is a continuation case of U.S. application Ser. No. 14/996,086, filed Jan. 14, 2016. U.S. application Ser. No. 14/996,086 is a continuation case of U.S. application Ser. No. 13/776,602, filed Feb. 25, 2013, which issued as U.S. Pat. No. 9,248,643. U.S. application Ser. No. 13/776,602 is a divisional application of U.S. application Ser. No. 13/551,209, filed Jul. 17, 2012, which issued as U.S. Pat. No. 8,720,366. U.S. application Ser. No. 13/551,209 is a continuation case of U.S. application Ser. No. 12/652,040, filed Jan. 5, 2010, now issued as U.S. Pat. No. 8,383,202. U.S. patent application Ser. No. 12/652,040 claims the benefit of U.S. Provisional Application No. 61/142,575, filed Jan. 5, 2009, and is also a continuation-in-part to U.S. patent application Ser. No. 12/139,391 filed Jun. 13, 2008 (now abandoned). The disclosure of each of the above-referenced related applications in this section is incorporated herein in its entirety.

BACKGROUND

Field of the Invention

The disclosure relates to a method and apparatus for efficient deposition of a patterned film on a substrate. More specifically, the disclosure relates to a method and apparatus for supporting and transporting a substrate on gas bearing during thermal jet printing of material on a substrate.

Description of Related Art

The manufacture of organic light emitting devices (OLEDs) requires depositing one or more organic films on a substrate and coupling the top and bottom of the film stack to electrodes. The film thickness is a prime consideration. The total layer stack thickness is about 100 nm and each layer is optimally deposited uniformly with an accuracy of better than .+-.1 nm. Film purity is also important. Conventional apparatuses form the film stack using one of two methods: (1) thermal evaporation of organic material in a relative vacuum environment and subsequent condensation of the organic vapor on the substrate; or, (2) dissolution of organic material into a solvent, coating the substrate with the resulting solution, and subsequent removal of the solvent.

Another consideration in depositing the organic thin films of an OLED is placing the films precisely at the desired location on the substrate. There are two conventional technologies for performing this task, depending on the method of film deposition. For thermal evaporation, shadow masking is used to form OLED films of a desired configuration. Shadow masking techniques require placing a well-defined mask over a region of the substrate followed by depositing the film over the entire substrate area. Once deposition is complete, the shadow mask is removed. The regions exposed through the mask define the pattern of material deposited on the substrate. This process is inefficient as the entire substrate must be coated, even though only the regions exposed through the shadow mask require a film. Furthermore, the shadow mask becomes increasingly coated with each use, and must eventually be discarded or cleaned. Finally, the use of shadow masks over large areas is made difficult by the need to use very thin masks (to achieve small feature sizes) that make said masks structurally unstable. However, the vapor deposition technique yields OLED films with high uniformity and purity and excellent thickness control.

For solvent deposition, ink jet printing can be used to deposit patterns of OLED films. Ink jet printing requires dissolving organic material into a solvent that yields a printable ink. Furthermore, ink jet printing is conventionally limited to the use of single layer OLED film stacks, which typically have lower performance as compared to multilayer stacks. The single-layer limitation arises because printing typically causes destructive dissolution of any underlying organic layers. Finally, unless the substrate is first prepared to define the regions into which the ink is to be deposited, a step that increases the cost and complexity of the process, ink jet printing is limited to circular deposited areas with poor thickness uniformity as compared to vapor deposited films. The material quality is also lower due to structural changes in the material that occur during the drying process and due to material impurities present in the ink. However, the ink jet printing technique is capable of providing patterns of OLED films over very large areas with good material efficiency.

No conventional technique combines the large area patterning capabilities of ink jet printing with the high uniformity, purity, and thickness control achieved with vapor deposition for organic thin films. Because ink jet processed single layer OLED devices continue to have inadequate quality for widespread commercialization, and thermal evaporation remains impractical for scaling to large areas, it is a major technological challenge for the OLED industry to develop a technique that can offer both high film quality and cost-effective large area scalability.

Manufacturing OLED displays may also require the patterned deposition of thin films of metals, inorganic semiconductors, and/or inorganic insulators. Conventionally, vapor deposition and/or sputtering have been used to deposit these layers. Patterning is accomplished using prior substrate preparation (e.g., patterned coating with an insulator), shadow masking as described above, and when a fresh substrate or protective layers are employed, conventional photolithography. Each of these approaches is inefficient as compared to the direct deposition of the desired pattern, either because it wastes material or requires additional processing steps. Thus, for these materials as well there is a need for a method and apparatus for depositing high-quality, cost effective, large area scalable films.

Certain applications of thermal jet printing require non-oxidizing environment to prevent oxidation of the deposited materials or associated inks. In a conventional method, a sealed nitrogen tent is used to prevent oxidation. Conventional systems use a floating system to support and move the substrate. A floatation system can be defined as a bearing system of alternative gas bearings and vacuum ports. The gas bearings provide the lubricity and non-contacting support for the substrate, while the vacuum supports the counter-force necessary to strictly control the height at which the relatively light-weight substrate floats. Since high-purity nitrogen gas can be a costly component of the printing system, it is important to minimize nitrogen loss to the ambient.

Accordingly, there is a need for load-locked printing system which supports a substrate on gas bearings while minimizing system leakage and nitrogen loss.

SUMMARY

The disclosure relates to a method and apparatus for preventing oxidation or contamination during a thermal jet printing operation. The thermal jet printing operation may include OLED printing and the printing material may include suitable ink composition. In an exemplary embodiment, the printing process is conducted at a load-locked printer housing having one or more chambers. Each chamber is partitioned from the other chambers by physical gates or fluidic curtains. A controller coordinates transportation of a substrate through the system and purges the system by timely opening appropriate gates. The substrate may be transported using gas bearings which are formed using a plurality of vacuum and gas input portals. The controller may also provide a non-oxidizing environment within the chamber using a gas similar to, or different from, the gas used for the gas bearings. The controller may also control the printing operation by energizing the print-head at a time when the substrate is positioned substantially thereunder.

In one embodiment, the disclosure relates to a method for printing a film of OLED material on a substrate by (i) receiving the substrate at an inlet chamber; (ii) flooding the inlet load-locked chamber with a noble gas and sealing the inlet chamber; (iii) directing at least a portion of the substrate to a print-head chamber and discharging a quantity of OLED material from a thermal jet discharge nozzle onto the portion of the substrate; (iv) directing the substrate to an outlet chamber; (v) partitioning the print-head chamber from the outlet chamber; and (vi) unloading the print-head from the outlet chamber. In one embodiment of the invention, the print-head chamber pulsatingly delivers a quantity of material from a thermal jet discharge nozzle to the substrate.

In another embodiment, the disclosure relates to a method for depositing a material on a substrate. The method includes the steps of: (i) receiving the substrate at an inlet chamber; (ii) flooding the inlet chamber with a chamber gas and sealing the inlet chamber; (iii) directing at least a portion of the substrate to a print-head chamber and discharging a quantity of material from a thermal jet discharge nozzle onto the portion of the substrate; (iv) directing the substrate to an outlet chamber; (v) partitioning the print-head chamber from the outlet chamber; and (vi) unloading the print-head from the outlet chamber. The print-head chamber pulsatingly delivers a quantity of material from a thermal jet discharge nozzle to the substrate.

In another embodiment, the disclosure relates to a load-locked printing apparatus, comprising an inlet chamber for receiving a substrate, the inlet chamber having a first partition and a second partition; a print-head chamber in communication with the inlet chamber, the print-head chamber having a discharge nozzle for pulsatingly metering a quantity of ink onto a substrate, the second partition separating the print-head chamber from the inlet chamber; an outlet chamber in communication with the print-head chamber through a third partition, the outlet chamber receiving the substrate from print head chamber and exiting the substrate from a fourth chamber. In a preferred embodiment, the inlet chamber, the print-head chamber and the outlet chamber provide an inert gas environment while the discharge nozzle pulsatingly meters the quantity of ink onto the substrate. Although the implementation of the invention are not limited thereto, the inert gas environment can be a noble gas (e.g. argon, helium, nitrogen or hydrogen).

In still another embodiment, the disclosure relates to a load-locked thermal jet printing system. The system includes a housing with an inlet partition and an outlet partition. The housing defines a print-head chamber for depositing a quantity of ink onto a substrate. The housing also includes an inlet partition and an outlet partition for receiving and dispatching the substrate. A gas input provides a first gas to the housing. A controller communicates with the print-head chamber, the gas input and the inlet and outlet partitions. The controller comprises a processor circuit in communication with a memory circuit, the memory circuit instructing the processor circuit to (i) receive the substrate at the inlet partition; (ii) purge the housing with the first gas; (iii) direct the substrate to a discharge nozzle at the print-head chamber; (iv) energize the thermal jet discharge nozzle to pulsatingly deliver a quantity of film material from the discharge nozzle onto the substrate; and (v) dispatch the substrate from the housing through the outlet partition.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
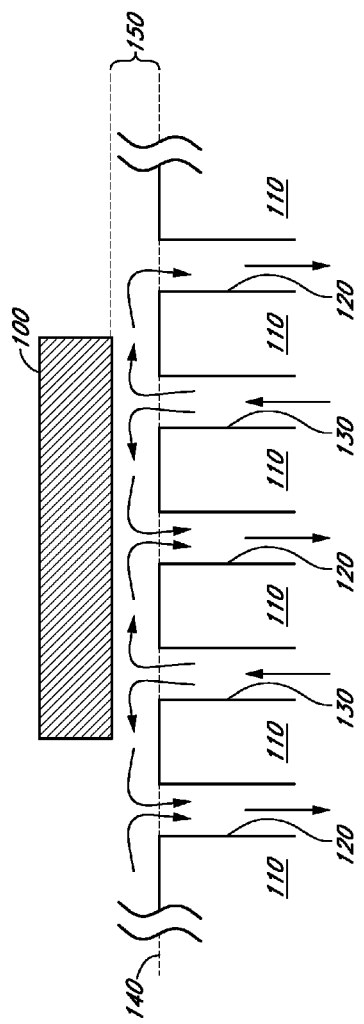
FIG. 1 is a schematic representation of a conventional substrate floatation system.

FIG. 1 is a schematic representation of a conventional substrate floatation system. More specifically, FIG. 1 shows a portion of a flotation system in which substrate 100 is supported by air bearings. The air bearings are shown schematically as arrows entering and leaving between baffles 110. The substrate floatation system of FIG. 1 is typically housed in a sealed chamber (not shown). The chamber includes multiple vacuum outlet ports 120 and gas bearing inlet ports 130, which are typically arranged on a flat surface 140. Substrate 100 is lifted and kept off a hard surface by the pressure of a gas such as nitrogen. The flow out of the bearing volume is accomplished by means of multiple vacuum outlet ports 120. The floating height 150 is typically a function of the gas pressure and flow. In principle, any gas can be utilized for such a substrate floatation system; however, in practice it is preferable to utilize a floatation gas that is inert to the materials that come into contact with the gas. As a result, it is conventional to use noble gases (e.g., nitrogen, argon, and helium) as they usually demonstrate sufficient inertness.

The floatation gas is an expensive component of the substrate floatation system. The cost is compounded when the printing system calls for substantially pure gas. Thus, it is desirable to minimize any gas loss to the environment.

Figure 2:
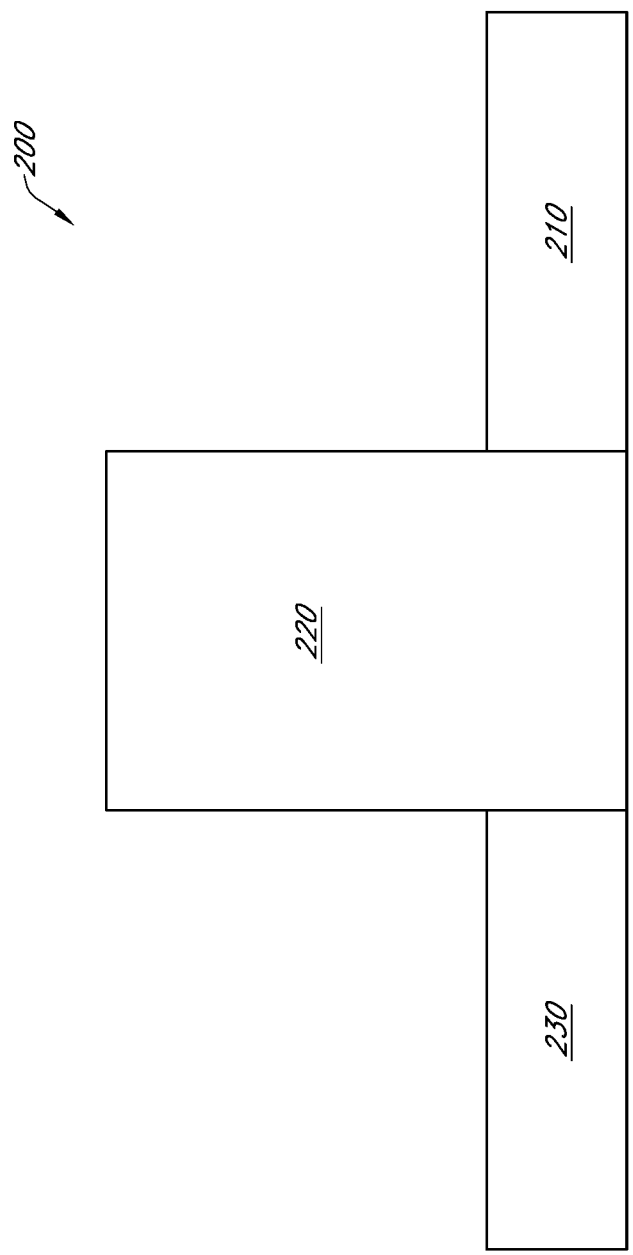
FIG. 2 is a schematic representation of an exemplary load-locked printing housing.

FIG. 2 is a simplified representation of an exemplary load-locked printing housing according to one embodiment of the disclosure. Housing 200 is divided into three chambers, including inlet chamber 210, print-head chamber 220 and outlet chamber 230. As will be discussed, each chamber is separated from the rest of housing 200 through a gate or a partition. In one embodiment of the disclosure the gates or partitions substantially seal the chambers from the ambient environment and from the rest of housing 200. In another embodiment of the disclosure (not shown), chamber 230 is not included in housing 200, and chamber 210 is utilized as both an inlet and an outlet chamber.

Figure 3:
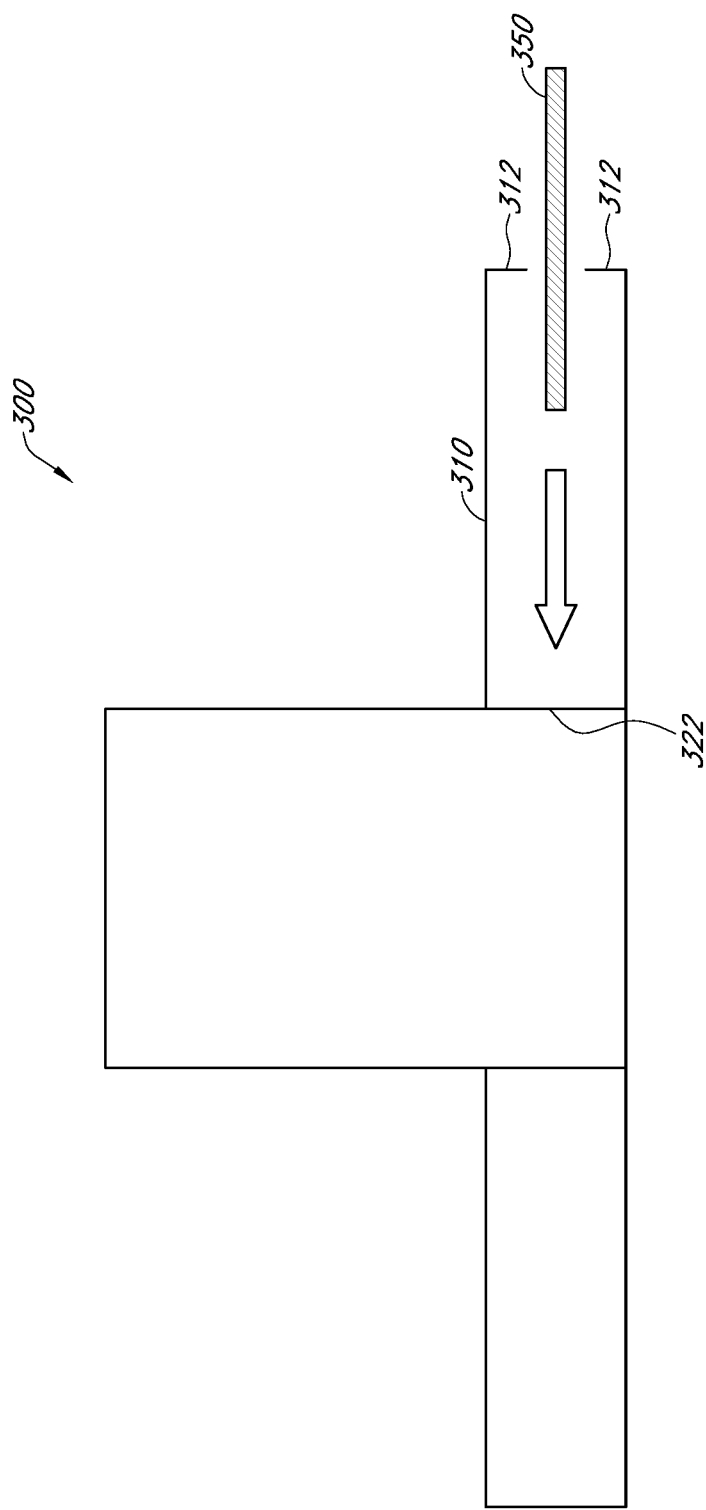
FIG. 3 is a schematic representation of the load-locked printing housing of FIG. 2 receiving a substrate.

FIG. 3 is a schematic representation of the load-locked printing housing of FIG. 2 receiving a substrate. During operation, substrate 350 is received at inlet chamber 310 through inlet gates 312. Inlet gates 312 can comprise a variety of options, including single or multiple moving gates. The gates can also be complemented with an air curtain (not shown) for minimizing influx of ambient gases into inlet chamber 310. Alternatively, the gates can be replaced with air curtains acting as a partition. Similar schemes can be deployed in all gates of the housing. Once substrate 350 is received at inlet chamber 310, inlet gates 312 close. The substrate can then be detained at inlet chamber 310. At this time, the inlet chamber can be optionally purged from any ambient gases and refilled with the desired chamber gas, which is conventionally selected to be the same as the floatation gas, e.g. pure nitrogen or other noble gases. During the purging process, print-head inlet gate 322 as well as inlet gate 312 remain closed. Print-head inlet gate 322 can define a physical or a gas curtain. Alternatively, print-head inlet gate 322 can define a physical gate similar to inlet gate 312.

Figure 4:
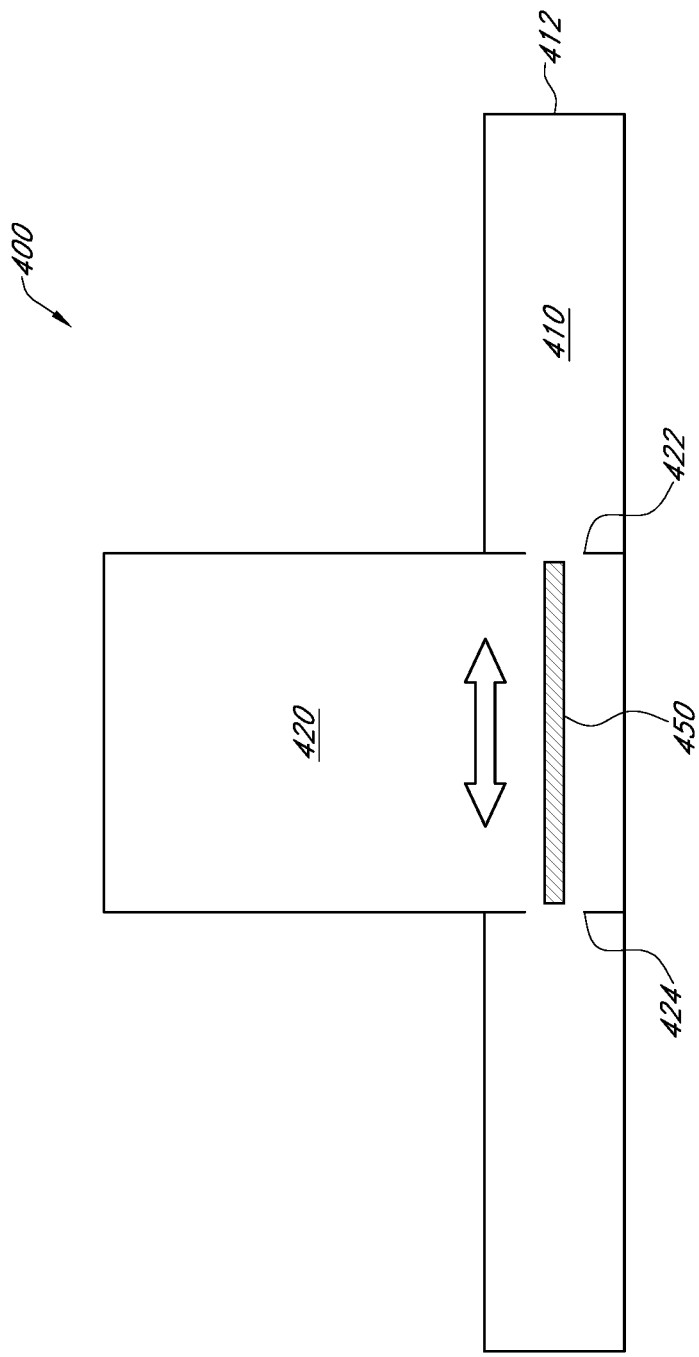
FIG. 4 schematically shows the substrate received at the print-head chamber of the housing.

FIG. 4 schematically shows the substrate received at the print-head chamber of the housing. Air bearings can be used to transport substrate 450 from inlet chamber 410 through print-head inlet gate 422 and into print-chamber 420. Print-head chamber 420 houses the thermal jet print-head, and optionally, the ink reservoir. The printing process occurs at print-head chamber 420. In one implementation of the invention, once substrate 450 is received at print-head chamber 420, print-head gates 422 and 424 are closed during the printing process. Print-head chamber can be optionally purged with a chamber gas (e.g., high purity nitrogen) for further purification of the printing environment. In another implementation, substrate 450 is printed while gates 422 and 424 remain open. During the printing operation, substrate 450 can be supported by air bearings. The substrate's location in relation to housing 400 can be controlled using a combination of air pressure and vacuum, such as those shown in FIG. 1. In an alternative embodiment, the substrate is transported through housing 400 using a conveyer belt.

Figure 5:
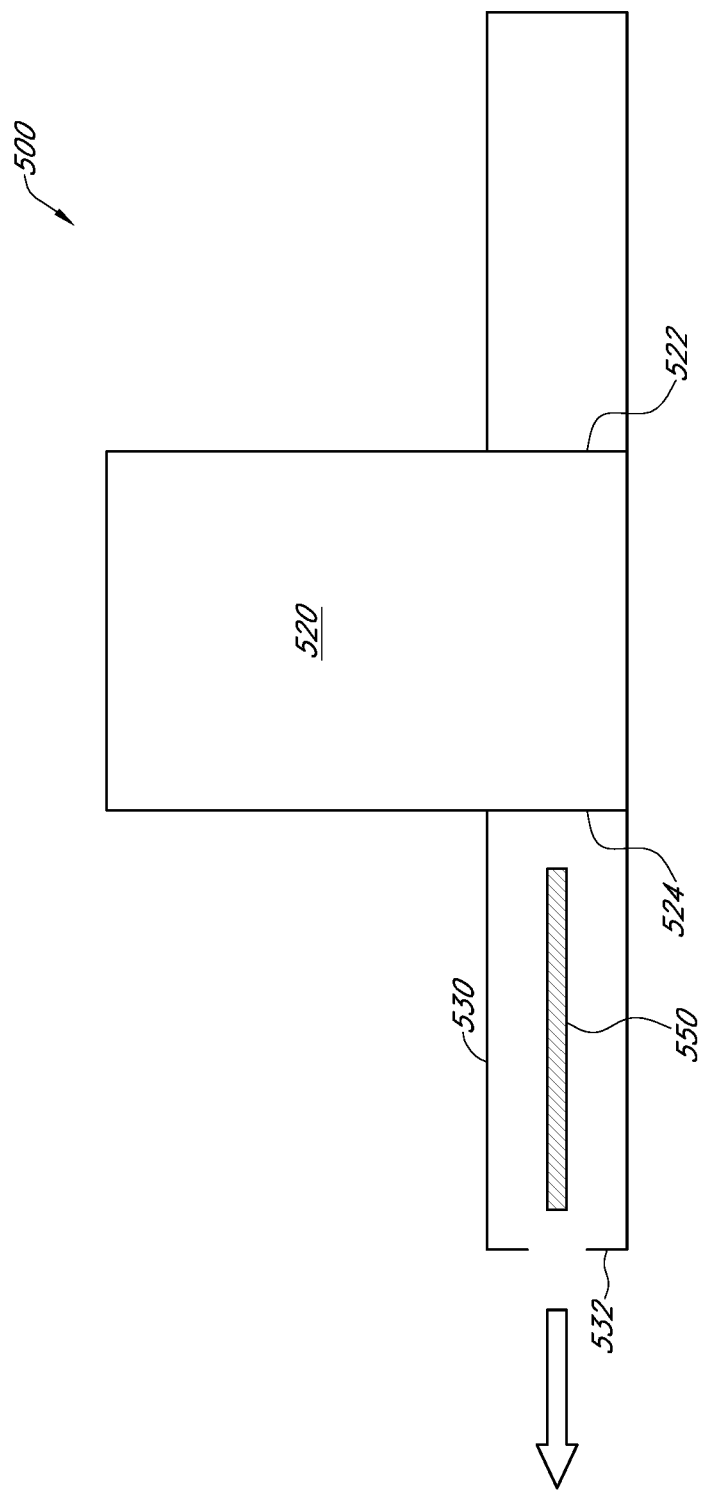
FIG. 5 schematically shows the completion of the printing process of FIGS. 3 and 4.

Once the printing process is complete, the substrate is transported to the outlet chamber as shown in FIG. 5. Here, print-head gates 522 and 524 are closed to seal off outlet chamber 530 from the remainder of housing 500. Outlet gate 532 is opened to eject substrate 550 as indicated by the arrow. The process shown in FIGS. 3-5 can be repeated to continuously print OLED materials on multiple substrates. Alternatively, gates 512, 522, 524 and 532 can be replaced with air curtains to provide for continuous and uninterrupted printing process. In another embodiment of the disclosure, once the printing process is complete, the substrate is transported back to the inlet chamber 310 through gate 322, where gate 322 can be subsequently sealed off and gate 312 opened to eject the substrate. In this embodiment, inlet chamber 310 functions also as the outlet chamber, functionally replacing outlet chamber 530.

The print-head chamber houses the print-head. In a preferred embodiment, the print-head comprises an ink chamber in fluid communication with nozzle. The ink chamber receives ink, comprising particles of the material to be deposited on the substrate dissolved or suspended in a carrier liquid, in substantially liquid form from a reservoir. The ink head chamber then meters a specified quantity of ink onto an upper face of a thermal jet discharge nozzle having a plurality of conduits such that upon delivery to the upper face, the ink flows into the conduits. The thermal jet discharge nozzle is activated such that the carrier liquid is removed leaving behind in the conduits the particles in substantially solid form. The thermal jet discharge nozzle is then further pulsatingly activated to deliver the quantity of material in substantially vapor form onto the substrate, where it condenses into substantially solid form.

Figure 6:
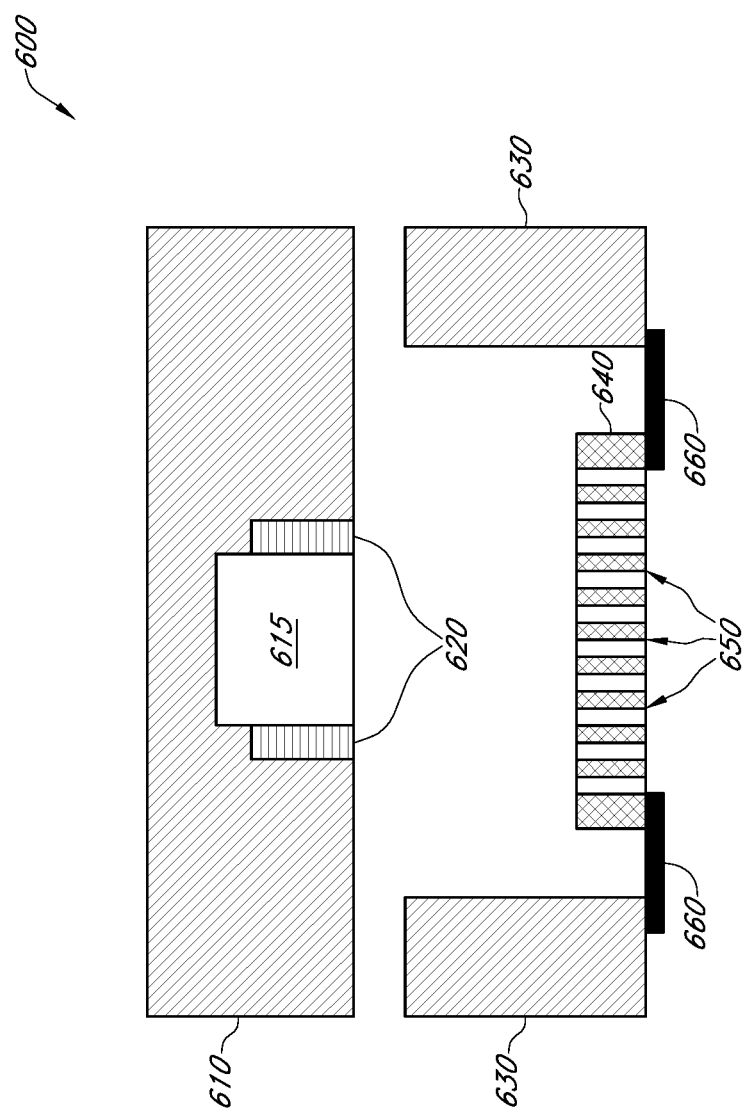
FIG. 6 is a schematic representation of a print-head for use with the load-locked housing of FIG. 2.

FIG. 6 is a schematic representation of a thermal jet print-head for use with the load-locked housing of FIG. 2. Print-head 600 includes ink chamber 615 which is surrounded by top structure 610 and energizing element 620. Ink chamber 615 is in liquid communication with an ink reservoir (not shown). Energizing element 620 can comprise a piezoelectric element or a heater. Energizing element 620 is energized intermittently to dispense a metered quantity of ink, optionally in the form of a liquid droplet, on the top surface of the thermal jet discharge nozzle 640.

Bottom structure 630 supports nozzle 640 through brackets 660. Brackets 660 can include and integrated heating element. The heating element is capable of instantaneously heating thermal jet discharge nozzle 640 such that the ink carrier liquid evaporates from the conduits 650. The heating element is further capable of instantaneously heating the thermal jet discharge nozzle 650 such that substantially solid particles in the discharge nozzle are delivered from the conduits in substantially vapor form onto the substrate, where they condense into substantially solid form.

Print-head 600 operates entirely within the print-head chamber 220 and housing 200 of FIG. 2. Thus, for properly selected chamber and floatation gases (e.g. high purity nitrogen in most instances), the ink is not subject to oxidation during the deposition process. In addition, the load-locked housing can be configured to receive a transport gas, such as a noble gas, for carrying the material from the thermal jet discharge nozzle 640 onto the substrate surface. The transport gas may also transport the material from the thermal jet discharge nozzle 640 to the substrate by flowing through conduits 650. In a preferred embodiment, multiple print-heads 600 are arranged within a load-locked print system as an array. The array can be configured to deposit material on a substrate by activating the print-heads simultaneously or sequentially.

Figure 7:
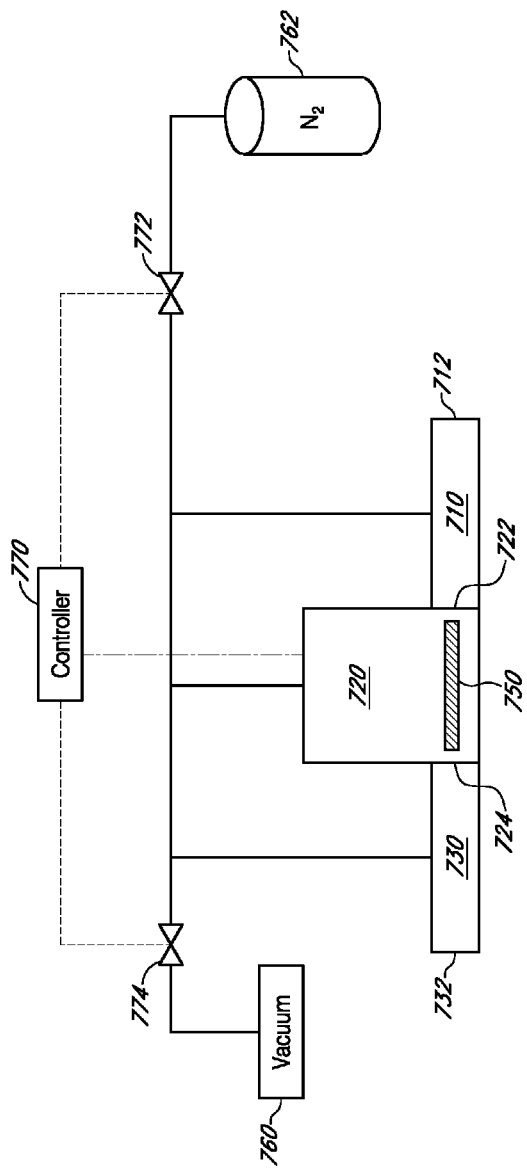
FIG. 7 is an exemplary load-locked system according to an embodiment of the invention.

FIG. 7 is an exemplary load-locked system according to an embodiment of the invention. Load-locked system of FIG. 7 includes a housing with inlet chamber 710, print-head chamber 720 and outlet chamber 730. Inlet chamber 710 communicates through gates 712 and 722. Print-head chamber 720 receives substrate 750 from the inlet chamber and deposits organic LED material thereon as described in relation to FIG. 6. Gate 724 communicates substrate 750 to outlet chamber 730 after the printing process is completed. The substrate exists outlet chamber 730 through gate 732.

Vacuum and pressure can be used to transport substrate 750 through the load-locked system of FIG. 7. To control transporting the substrate, controller 770 communicates with nitrogen source 762 and vacuum 760 through valves 772 and 774, respectively. Controller 770 comprises one or more processor circuits (not shown) in communication with one or more memory circuit (not shown). The controller also communicates with the load-locked housing and ultimately with the print nozzle. In this manner, controller 770 can coordinate opening and closing gates 712, 722, 724 and 732. Controller 770 can also control ink dispensing by activating the piezoelectric element and/or the heater (see FIG. 6). The substrate can be transported through the load-locked print system through air bearings or by a physical conveyer under the control of the controller.

In an exemplary operation, a memory circuit (not shown) of controller 770 provides instructions to a processor circuit (not shown) to: (i) receive the substrate at the inlet partition; (ii) purge the housing with the first gas; (iii) direct the substrate to a discharge nozzle at the print-head chamber; (iv) energize the discharge nozzle to pulsatingly deliver a quantity of material from the thermal jet discharge nozzle onto the substrate; and (v) dispatch the substrate from the housing through the outlet partition. The first gas and the second gas can be different or identical gases. The first and/or the second gas can be selected from the group comprising nitrogen, argon, and helium.

Controller 770 may also identify the location of the substrate through the load-locked print system and dispense ink from the print-head only when the substrate is at a precise location relative to the print-head.

Another aspect of the invention relates to registering the substrate relative to the print-head. Printing registration is defined as the alignment and the size of one printing process with respect to the previous printing processes performed on the same substrate. In order to achieve appropriate registration, the print-head and the substrate need to be aligned substantially identically in each printing step. In one implementation of the invention, the substrate is provided with horizontal motion (i.e., motion in the x direction) and the print-head is provided with another horizontal motion (i.e., motion in the y direction). The x and y directions may be orthogonal to each other. With this arrangement, the movement of the print-head with respect to the substrate can be defined with a combination of these two horizontal directions.

When the substrate is loaded onto a load-locked system, the areas to be printed are usually not perfectly aligned in the x and y directions of the system. Thus, there is a need for detecting the misalignment, determining the required corrections to the motion of the print-head relative to the substrate and applying the corrections.

According to one embodiment of the invention, the pattern or the previous printing is detected using a pattern recognition system. This pattern can be inherent in the previous printing or may have been added deliberately (i.e., fiducials) for the pattern recognition step. By means of its recognition of the pattern, the misalignment of the substrate to the printing system's motion, direction or axis can be determined. This manifests itself as a magnification misalignment, a translational misalignment and an angular misalignment.

Figure 8:
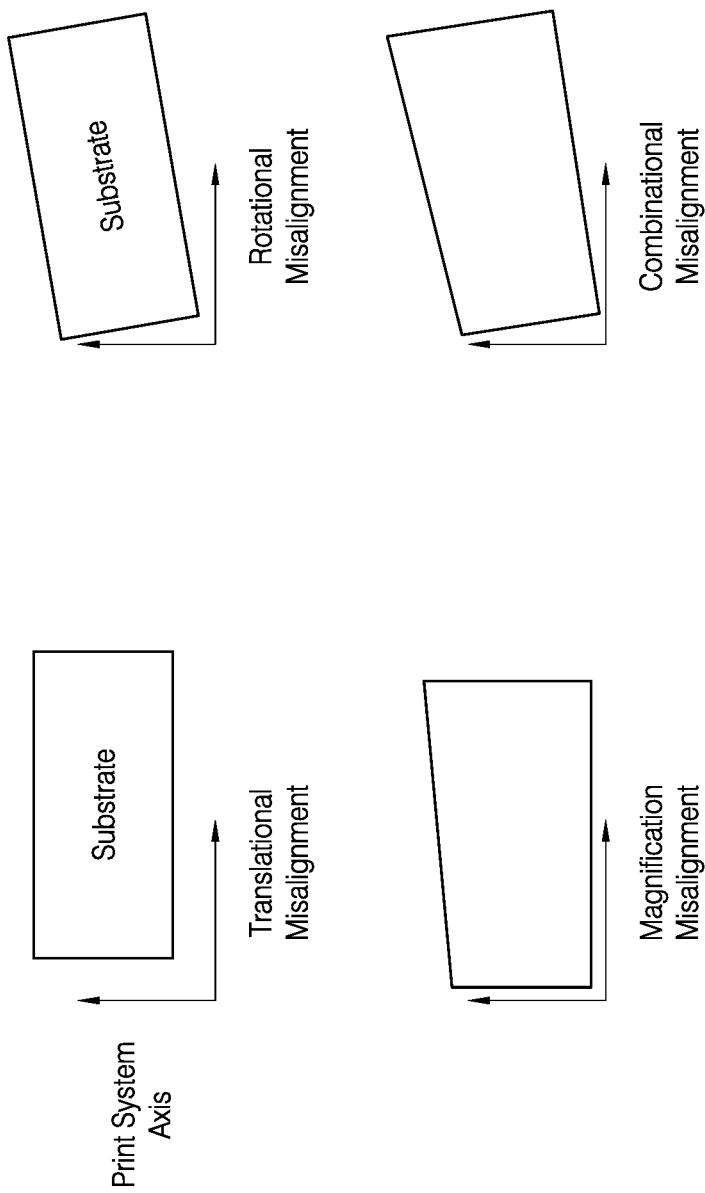
FIG. 8 shows several types of substrate misalignment within the print system.

FIG. 8 shows several types of substrate misalignment within the print system, including translational misalignment, rotational misalignment, magnification misalignment and combinational misalignment. For each print-head scan motion relative to the substrate, the pattern recognition system will look for and find/recognize the desired pattern. The pattern recognition system can optionally be integrated with the controller (see FIG. 7). The pattern recognition system will look for and find/recognize the desired pattern. The pattern recognition system will provide the degree of error/misalignment in the x and y directions to the system's controller, which will then reposition the print-head and substrate to eliminate the error/misalignment. This means that for several motions of the print-head with respect to the substrate, the motion control system will check for misalignment and make the necessary corrections.

Figure 9:
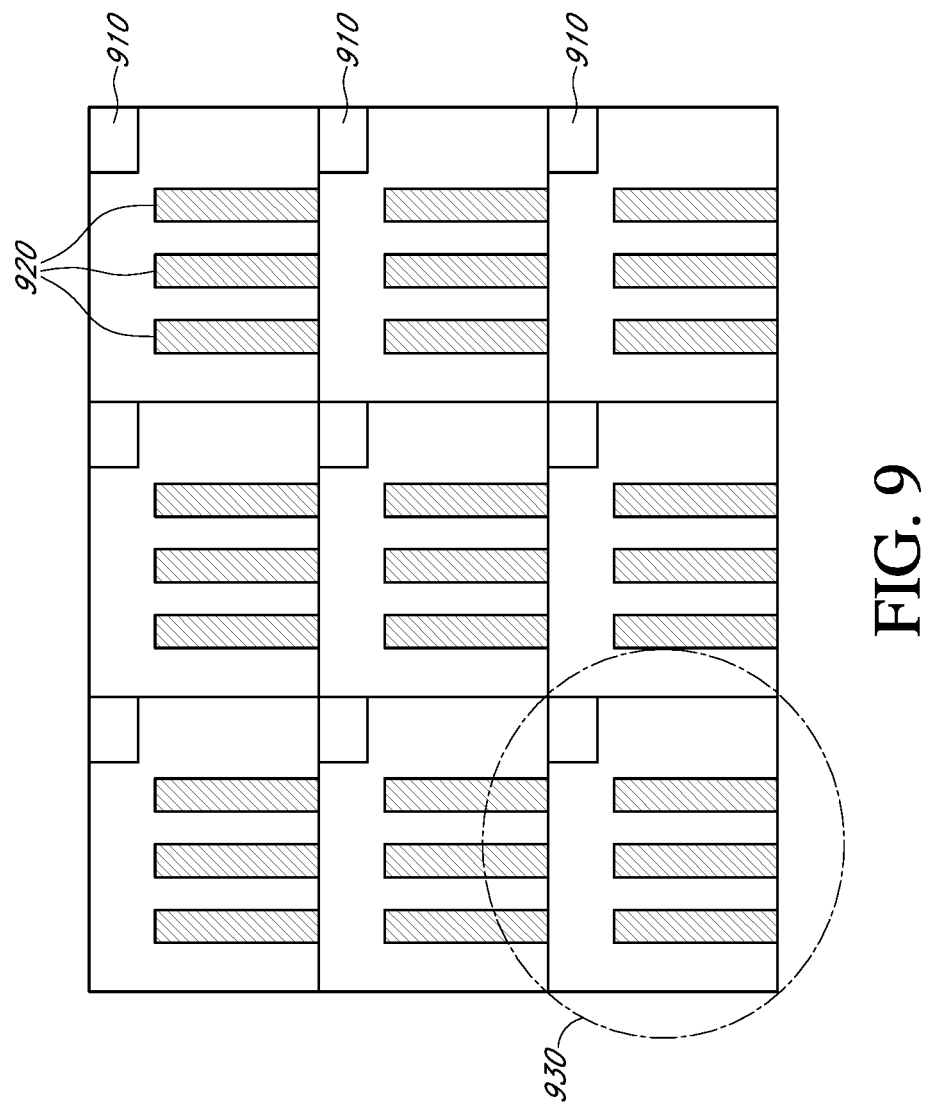
FIG. 9 shows a substrate pattern including fiducials and initial locus of area viewed by a camera or other imaging devices.

Alternatively, an initial scan of the entire substrate can be performed by the pattern recognition system utilizing the x and y motions available in the printing system. FIG. 9 shows a substrate pattern including fiducials and initial locus of area viewed by a camera or other imaging devices. In FIG. 9, fiducials or alignment targets are identified as boxes 910 in each replicated "pixel." Each pixel in this example, and in many OLED applications, comprises three sub-pixels each having a distinct color: red, green, and blue (RGB). The camera or the pattern recognition device initially focuses on an area of the substrate identified by circle 930. Once the amount of misalignment is determined, the motion control system can compensate for the misalignment by causing the x and the y directions to move in a rotated and translated set of axes $x_1$ and $y_1$ such that these axis are a linear combination of the previous motions.

For either alignment technique, the printing control system will then cause the print-head to fire appropriately at the desired print axis as it scans the substrate. In the case of the embodiment described above, the print system will periodically use the pattern recognition system to update and adjust for any misalignment, causing the print-head to fire after alignment has been achieved. Depending on the degree of misalignment, the required update and adjustment steps may have to be repeated more often during the printing operations. Alternatively, the pattern recognition system must scan the substrate initially to assess the amount and direction of misalignment, then printing control system will utilize the misalignment information to adjust the print-head firing accordingly.

While the principles of the disclosure have been illustrated in relation to the exemplary embodiments shown herein, the principles of the disclosure are not limited thereto and include any modification, variation or permutation thereof. For example, while the exemplary embodiments are discussed in relation to a thermal jet discharge nozzle, the disclosed principles can be implemented with different type of nozzles. Moreover, the same or different gases can be used for floating the substrate and for providing a non-oxidizing environment within the chamber. These gases need not be noble gases. Finally, the substrate may enter the system from any direction and the schematic of a tri-chamber system is entirely exemplary.

What is claimed is:

1. A method for forming a film on a substrate, the method comprising:
    receiving a substrate at a substrate-inlet region;
    transporting the substrate to a substrate-printing region comprising an inert gas environment;
    floating the substrate in the substrate-printing region, wherein the substrate is floated using a substrate floatation system comprising at least one gas inlet port and at least one gas outlet port;
    while floating the substrate in the substrate-printing region:
        moving the substrate in a first direction and moving the at least one print-head in a second direction, the first and second directions being orthogonal to to each other, and
        printing a material on a surface of the substrate with at least one print-head having at least one nozzle,
        wherein each of the first and second orthogonal directions is orthogonal to a direction normal to the surface of the substrate the material is printed on;

transporting the substrate away from the substrate-printing region; and removing the substrate from a substrate-outlet region.

2. The method of claim 1, wherein the substrate floatation system is configured to provide gas inflow from the at least one gas inlet port and gas outflow from the at least one gas outlet port.

3. The method of claim 1, wherein the substrate floatation system is configured to float the substrate at a floating height that is a function of gas inflow from the at least one gas inlet port and gas outflow from the at least one gas outlet port.

4. The method of claim 1, further comprising after receiving a substrate at a substrate-inlet region:
isolating the substrate-inlet region; and,
providing the substrate-inlet region with an inert-gas environment.

5. The method of claim 1, further comprising after transporting the substrate to a substrate-printing region:
isolating the substrate-printing region.

6. The method of claim 1, further comprising aligning the substrate along the first direction before printing the material on the substrate.

7. The method of claim 1, further comprising after transporting the substrate away from the substrate-printing region:
moving the substrate to a substrate-outlet region; and
isolating the substrate-printing region from the substrate-outlet region.

8. The method of claim 1, wherein the substrate-inlet region and the substrate-outlet region are the same region.

9. The method of claim 1, wherein said inert-gas environment comprises a non- oxidizing environment.

10. The method of claim 1, wherein said inert-gas environment comprises a nitrogen- gas environment.

11. The method of claim 1, wherein a floatation gas used with the substrate floatation system comprises an inert gas.

12. The method of claim 11, wherein the inert gas is nitrogen.

13. The method of claim 1, wherein printing the material on the surface of the substrate comprises printing the material in a pattern on the surface of the substrate.

14. The method of claim 13, wherein the material is printed in a pattern on the surface of the substrate to form an OLED display.

15. The method of claim 1, wherein said material comprises an organic material.

16. The method of claim 15, wherein the organic material comprises an OLED material.

17. The method of claim 1, wherein the print-head comprises an ink chamber in flow communication with a nozzle.

18. The method of claim 1, wherein the at least one print-head is an inkjet print-head.

19. The method of claim 1, wherein:
the at least one print-head comprises an energizing element, and
in response to energizing of the energizing element, the at least one print-head is actuated to dispense a metered quantity of ink.

* * * * *